United States Patent
Edlinger

(10) Patent No.: US 11,116,071 B2
(45) Date of Patent: Sep. 7, 2021

(54) METHOD FOR PRODUCING A PRINTED CIRCUIT BOARD HAVING THERMAL THROUGH-CONTACTS

(71) Applicant: ZKW Group GmbH, Wieselburg (AT)

(72) Inventor: Erik Edlinger, Vienna (AT)

(73) Assignee: ZKW Group GmbH, Wieselburg (AT)

(*) Notice: Subject to any disclaimer, the term of this patent is extended or adjusted under 35 U.S.C. 154(b) by 75 days.

(21) Appl. No.: 16/754,693

(22) PCT Filed: Oct. 8, 2018

(86) PCT No.: PCT/AT2018/060235
§ 371 (c)(1),
(2) Date: Apr. 8, 2020

(87) PCT Pub. No.: WO2019/071283
PCT Pub. Date: Apr. 18, 2019

(65) Prior Publication Data
US 2020/0236775 A1    Jul. 23, 2020

(30) Foreign Application Priority Data

Oct. 12, 2017  (AT) .............................. A 50871/2017

(51) Int. Cl.
*H05K 3/00*    (2006.01)
*H05K 1/02*    (2006.01)
(Continued)

(52) U.S. Cl.
CPC ........... *H05K 1/0206* (2013.01); *H05K 1/113* (2013.01); *H05K 3/0094* (2013.01);
(Continued)

(58) Field of Classification Search
CPC ...... H05K 3/0094; H05K 3/3452; H05K 3/42; H05K 2203/045; H05K 2203/1476;
(Continued)

(56) References Cited

U.S. PATENT DOCUMENTS 5,129,142 A * 7/1992 Bindra ................... H05K 3/445
   29/830
5,407,864 A * 4/1995 Kim ....................... H05K 3/305
   29/834
(Continued)

FOREIGN PATENT DOCUMENTS

JP       H01211992 A1    8/1989

OTHER PUBLICATIONS

Search Report for Austrian Patent Application No. 50826/2017, dated Jul. 13, 2018 (1 page).
(Continued)

*Primary Examiner* — Donghai D Nguyen
(74) *Attorney, Agent, or Firm* — Eversheds Sutherland (US) LLP

(57) ABSTRACT

In a printed circuit board (1), thermal vias (19) are formed between the lower surface (A) and an upper surface (B) of the substrate plate (10) of the printed circuit board through the steps of: applying a respective solder resist mask (21, 31) to the lower surface (A) and the upper surface (B); applying solder to the lower surface (A) and reflow soldering the solder, wherein the solder penetrates into the boreholes (20) and forms convex menisci (26) protruding beyond the edge (22) of the respective boreholes on the lower surface (A); and creating regions (35) on the upper surface (B), which are freed from solder resist material, and which are intended for contacting at least one electronic component (17) on the upper surface and each of which comprise at least one of the thermal vias. Subsequently, the upper surface (B) can be provided with electrical components (17) on these regions (35). The first solder resist mask (21) has a respective region (23) that is free of solder resist on the lower surface around the edge of every borehole (20).

14 Claims, 4 Drawing Sheets

(51) Int. Cl.
*H05K 1/11* (2006.01)
*H05K 3/34* (2006.01)
*H05K 3/42* (2006.01)

(52) U.S. Cl.
CPC .......... *H05K 3/3452* (2013.01); *H05K 1/112* (2013.01); *H05K 3/42* (2013.01); *H05K 2201/09481* (2013.01); *H05K 2201/09563* (2013.01); *H05K 2201/09572* (2013.01); *H05K 2201/09609* (2013.01); *H05K 2201/09627* (2013.01); *H05K 2201/09636* (2013.01); *H05K 2203/043* (2013.01); *H05K 2203/045* (2013.01); *H05K 2203/0455* (2013.01); *H05K 2203/1476* (2013.01)

(58) Field of Classification Search
CPC ..... H05K 2203/043; H05K 2203/0455; H05K 3/341; H05K 1/0206; H05K 1/113; H05K 1/112; Y10T 29/49126; Y10T 29/4913; Y10T 29/49165
USPC .................................. 29/830, 832, 846, 852
See application file for complete search history.

(56) References Cited

U.S. PATENT DOCUMENTS

| | | | |
|---|---|---|---|
| 6,190,941 | B1 | 2/2001 | Heinz et al. |
| 6,820,798 | B1 | 11/2004 | Heinz et al. |
| 6,929,975 | B2 | 8/2005 | Heinz et al. |
| 7,300,857 | B2 * | 11/2007 | Akram .............. H01L 21/76877 |
| | | | 438/459 |
| 7,606,038 | B2 | 10/2009 | Sugimura |
| 8,166,650 | B2 | 5/2012 | Thomas |
| 2005/0158668 | A1 | 7/2005 | Bittner et al. |
| 2012/0181067 | A1 | 7/2012 | Wen et al. |

OTHER PUBLICATIONS

International Preliminary Report on Patentability for PCT/AT2018/060235, dated Feb. 5, 2020 (13 pages).

Search Report for PCT/AT2018/060235, dated Jan. 7, 2019 (11 pages).

* cited by examiner

METHOD FOR PRODUCING A PRINTED CIRCUIT BOARD HAVING THERMAL THROUGH-CONTACTS

The invention relates to a method for producing thermal vias [thermal through-contacts] in a printed circuit board, proceeding from a substrate plate with a plurality of boreholes preformed therein, which are formed between the lower surface and the upper surface of the substrate plate and are located at positions where respective thermal vias are to be produced.

The invention also relates to a printed circuit board with a plurality of thermal vias, formed in a substrate plate of the printed circuit board and extending along boreholes which are formed between the lower surface and the upper surface of the substrate plate.

Printed circuit boards of the type considered here are widely used in the electronics industry.

They include a substrate plate, which carries a number of electronic components—hereinafter mostly referred to as "electronic components" or simply "components"—usually on one side of the substrate plate. The term "electronic component" is to be understood such that it is to comprise any electrical components which can be in electrical connection with printed circuit boards, such as chips, which comprise integrated circuits, digital or analogue processors but also simpler components, such as LEDs, resistors and more suchlike.

The side of the printed circuit board, or respectively substrate plate, carrying the components is designated within this disclosure as "upper surface"; the side opposite thereto is designated as "lower surface". Electrical connection lines for the components and, if applicable, other electrical installations may be situated on both sides of the printed circuit board, typically predominantly on the lower surface. In the case of a printed circuit board which has an equipping with components on both sides, in this disclosure the side which is equipped first with components is designated as "lower surface". In particular cases, it may be provided that for various regions of the substrate plate the roles of the lower surface and upper surface are exchanged, for example where components in certain regions are preferably to be mounted on the opposite side (which in these regions is then considered as the upper surface, otherwise as lower surface).

The body of the substrate plate consists conventionally of a plastic material or composite material, such as e.g. FR4, an epoxy resin-glass fibre material; suitable printed circuit board materials are known per se.

Terms regarding the location or an orientation, such as for example "upper", "lower", "front", "below", "above" etc. are selected in the description only for simplification and refer primarily to the representation in the drawings, but not necessarily to a position of usage or installation. In particular, the terms upper surface and lower surface in this description and in the claims serve only for the identification of the sides of a substrate plate and are not to be understood as being restrictive. Of course, the circuit board may be used or incorporated into equipment in any other possible orientation as well, e.g. reversed, upright or obliquely.

As the components generate heat during operation, owing to unavoidable power losses, generally also provision is to be made for a sufficient dissipation of the heat, in order to prevent damage to the components, up to their destruction. A cooling by ambient air and heat conduction in the printed circuit board is only sufficient in very simple cases; mostly, additional measures for passive or active cooling must be carried out. One known approach for the heat dissipation of thermally stressed components are thermal through-contacts; these are often referred to as "thermovias" or "thermal vias", also frequently abbreviated to just "vias". A via represents a thermally (and usually also electrically) conductive connection from the printed circuit board upper surface to the lower surface, in order to facilitate a heat transmission transversely through the printed circuit board and to bridge the thermal resistance of the printed circuit board material.

The industrial applications frequently provide a very dense equipping of the printed circuit board on both sides. Where a thermal optimization of such printed circuit board is desired, using through-contacts for this through vias, it is frequency necessary that these through-contacts must be situated under a component, for instance because the vias are to directly cool the component or no space is available for vias elsewhere. Here, in most cases the problem arises that during a soldering pass, in which for the second side a component is to be equipped onto the rear side of a through-contact which is already soldered or respectively filled with solder (from the front side), owing to the unevenness which the through-contact causes, an applying of the solder for the soldering process, for example by means of paste printing, is not possible or is only possible with difficulty, and/or the components which are to be equipped can no longer be placed in a well defined manner.

Known solutions for the production of vias provide for filling with copper pastes or epoxide pastes. However, vias thus filled entail considerable additional work and, associated therewith, increased costs. Alternatively, it is known to leave the vias without filling; however, unfilled vias are unsatisfactory owing to the lower heat conduction.

It is therefore an object of the present invention to establish a method for the production of printed circuit boards with vias, which is process-stable, reliable and nevertheless cost-saving, even if the vias are placed closely and on positions at which electronic components are arranged (equipped) as well.

This problem is solved by a method of the type mentioned in the introduction, which comprises the following steps:
applying a first and a second solder resist mask onto the lower surface or respectively the upper surface, wherein the first solder resist mask with the preformed boreholes respectively around the edge of each borehole has on the lower surface a region which is free from solder resist, wherein the second solder resist mask, for at least a majority (preferably each) of the preformed boreholes extends to at least the respective edges of the boreholes on the upper surface; which does not rule out that the second solder resist mask projects beyond the edge into the region of the opening;
applying solder onto the lower surface and reflow soldering of the solder, wherein the solder penetrates into the boreholes and forms convex menisci protruding beyond the edge of the respective boreholes on the lower surface; and
clearing regions on the upper surface, which regions are predetermined for the contacting of at least one electronic component on the upper surface and respectively comprise at least one of the thermal vias, by removing the second solder resist mask at least in said regions.

This technical solution produces a manufacturing process which enables filling vias with solder in the soldering process in a process-stable manner—i.e. avoiding solder beads, which can lead to leakage currents or short-circuits, and other form deviations of the solder material—and enables carrying out the equipping with components onto already filled vias. The use of solder as filling material of the vias provides a high heat conduction through the vias, which is distinctly higher than that of copper pastes or other pastes. The invention also provides a subsequent solder resist clearing after a first reflow soldering process, whereby the definition of solder fields ("pads") for the equipping of the components is made possible. Through this technical solution, a better quality of the equipping onto the filled vias also results, wherein a tipping of the components or an insufficient paste printing can be avoided.

According to a preferred embodiment of the method according to the invention, it is advantageous if in the first solder resist mask the regions free from solder resist are shaped like a circular ring. It is, in addition, favorable in many cases where the regions free from solder of immediately adjacent boreholes touch one another, whereby between the free regions areas with solder resist are formed, which preferably have the shape of quadrilaterals or triangles delimited by concave curve segments.

In order to facilitate the carrying out of the clearance on the upper surface and to increase the tolerance with respect to inaccuracies in the positioning of the mask on the upper surface, it can be expedient to have the second solder resist mask in at least a portion of said boreholes extending over the edge and forming freestanding, inwardly projecting rings there. This furthermore produces a better definition of the solder edge at the respective opening to the upper surface and prevents in particular an undesired flowing away of the solder.

Alternatively, provision may be made that the second solder resist mask in at least a portion of said boreholes reaches just up to the edge or, preferably, is flush with the edge of the borehole. This results in a more economical use of the solder resist material and facilitates the subsequent processing of the solder resist mask for producing the clearance regions.

For an easier handling of the soldering process, it may be suitable having the substrate plate with the lower surface oriented upwards during the step of the application of solder.

The method according to the invention can be supplemented by the subsequent additional step of equipping the upper surface, namely for contacting with at least one component on the cleared regions.

Furthermore, it is favorable where the menisci generated during reflow soldering of the solder on the lower surface form convex calottes respectively over the boreholes. Here, the term meniscus is understood to indicate a curved surface of the (fluid or re-solidified) solder, wherein the shape of the meniscus preferably, but not necessarily, has that of a calotte—i.e., a spherical calotte or ellipsoid calotte, but generally can also be flattened, if applicable also slightly dented, in so far as this is suitable for the respective application. At the same time, shaping the menisci as calottes produces a large surface of the menisci and a well-defined geometry of the surface of the menisci, which facilitates the targeted design for the heat dissipation. In addition, a large surface contributes to a better performance of the heat radiation, or respectively of the heat dissipation when e.g. heat-dissipating elements are later applied onto the menisci via a heat-conducting paste.

In addition, the additional step of lining the preformed boreholes with a metal may be carried out in advance, preferably with a metal having high electrical conductivity, such as copper; and preferably this lining step may take place by a galvanic method.

In order to achieve a reliable filling of the vias in good time, it is favorable if during the reflow soldering of the solder the boreholes into which the solder penetrates are filled by the solder. Likewise it is favourable if the menisci are formed by solder material, which at the same time fills the bores. These embodiments result in vias with a particularly good thermal performance.

Likewise, the problem forming the basis of the invention is solved by a printed circuit board in which the thermal vias have convex menisci protruding beyond the edge of the respective boreholes on the lower surface, and on the upper surface regions are provided which are cleared of a solder resist mask, which regions are equipped with solder material for the contacting of at least one electronic component on the upper surface and are in solder connection with at least one of the thermal vias.

Further advantageous embodiments of the printed circuit board correspond to those which result from the further developments of the method according to the invention. In particular, in the printed circuit board in addition the menisci on the lower surface can be circular, wherein preferably the menisci of immediately adjacent boreholes touch one another, wherein between these menisci respectively areas with solder resist lie, which preferably have the shape of quadrilaterals or triangles delimited by contact curve segments.

In summary, the invention achieves the following advantages:
- high thermal performance,
- only low additional costs through filling of the vias,
- reliability of the filling for vias in pads,
- possibility of use of the clearance also for other applications,
- a subsequent change to the solder resist mask is possible if required, and
- the vias can be filled with solder in good time, already at metallization (by means of HAL finish).

The invention including further advantages is explained below based on exemplary embodiments, which are illustrated in the drawings. The drawings show in schematic form by means of a sequence of respective sectional views of the substrate plate:

It shall be understood that the embodiments which are described here serve merely for illustration and are not to be interpreted as being restrictive for the invention; rather, all configurations which the person skilled in the art can find based on the description, are within the scope of protection of the invention, wherein the scope of protection is defined by the claims.

In the following figures, the same reference numbers are used for identical or comparable elements for the purpose of simpler explanation and illustration. The reference numbers used in the claims are intended further only to facilitate the readability of the claims and the understanding of the invention and are in no way impeding in nature with regard to the scope of protection of the invention.

Figure 1:
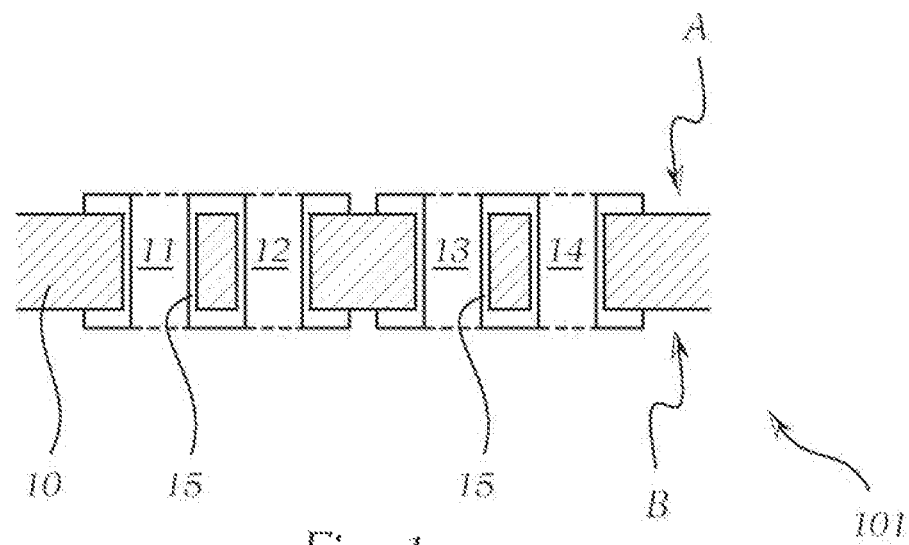
FIG. 1 shows a substrate plate of a first embodiment of the invention, wherein the substrate plate is temporarily turned around, so that its lower surface is turned upwards.
Figure 2:
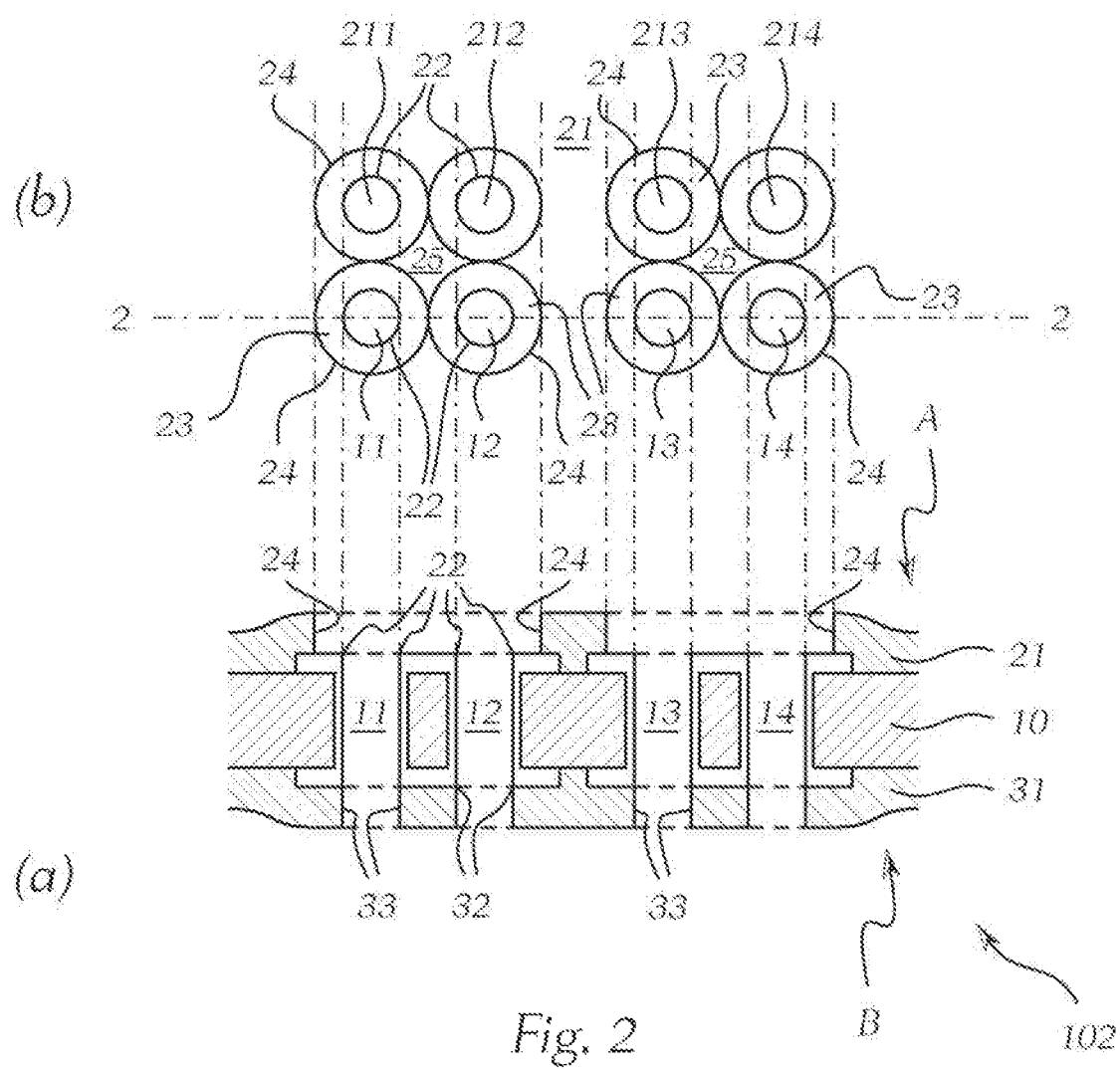
FIG. 2 shows the substrate plate with applied solder resist masks, and specifically in a sectional view in partial image (a) and in a top view onto the lower surface of the substrate plate in partial image (b)

In FIG. 1 a substrate plate 101 is shown, which in the first example embodiment serves as the starting point for the production method. The sectional views shown in FIG. 1 and in the subsequent figures correspond to a section through a row of boreholes, respectively along a section plane which corresponds to the section plane 2-2 in FIG. 2(a), wherein respectively the same portion of the substrate plate is shown in the successive stages of the production method.

The substrate plate 101 includes a base plate 10, for example a single- or multi-layered FR4 plate; FR4 plates are well known as base plates for printed circuit boards. The two surfaces of the substrate plate correspond to an lower surface A and an upper surface B. It is pointed out that in the illustrations of FIGS. 1 to 4 the substrate plate is oriented in a "turned around" manner, i.e. the lower surface A is turned upwards and the upper surface B is turned downwards. As explained in the introduction, the upper surface B is the side on which, with equipping of the substrate plate on one side, the electronic components are applied (cf. FIG. 6). Depending on the application layout of the printed circuit board which is to be produced, provision can also be made that for various regions of the substrate plate the roles of the lower surface and upper surface are exchanged, for example if components in certain regions are also mounted on the opposite side.

In the base plate 10 of the substrate plate 101 a plurality of boreholes are formed, of which four boreholes 11, 12, 13, 14 are shown in a representative manner in FIG. 1, and which have been produced by means of a suitable known method. Generally, the boreholes are situated on the substrate plate in a two-dimensional arrangement which has been established in advance. The positions in the two-dimensional arrangement are selected according to application and requirements at the locations where respectively vias (thermal vias) are to be produced; the actual positions of the vias or respectively boreholes, however, are not of further relevance for the invention. The boreholes 11-14 (and likewise the bores 211-214 of FIG. 2(b)) are provided respectively with their own reference numbers, but are realized in a similar way for the purposes of the present disclosure.

The bores 11-14 are preferably, but not necessarily, provided with a metallic lining (coating) 15. The metallic material of the coating 15 preferably has a high electrical conductivity. Preferred materials are e.g. copper, aluminium or carbon coating. This lining is produced for example immediately after the introducing of the boreholes into the base plate 10 by a suitable method known per se, e.g. a galvanic method. The lining 15 is illustrated with an exaggerated thickness in the drawings, for the sake of clarity.

Solder resist masks 21, 31 are now applied onto the substrate plate 101 on either sides. This produces the substrate plate 102, shown in FIG. 2, with a first solder resist mask 21 on the lower surface A of the substrate plate 102 and with a second solder resist mask 31 on the upper surface B of the substrate plate 102, as can be seen in the sectional view of FIG. 2(a). The height of the solder resist masks 21, 31 is illustrated in an exaggerated manner in the figures, for the purpose of clarity and in many embodiments is distinctly less than as shown. In order to enable a flat filling of the vias in the later stage of the method, cleared regions are provided in the solder resist masks 21, 31, so that the solder resist masks respectively exclude at least areas which correspond to the openings of the boreholes 11-14 on the upper surface or respectively lower surface.

FIG. 2(b) shows a detail of the first solder resist mask 21 in a top view of the substrate plate 102. Each borehole—in FIG. 2(b) beyond the boreholes 11-14 bores 211, 212, 213, 214 of a second row, arranged in parallel, are also illustrated—opens on the lower surface into an opening, the edge of which can be seen in FIG. 2(b) in each case as a circle: smaller circles 22. Around each of the edges 22 a solder resist clearance 23 is provided, so that a free region remains up to an outer edge, shown in each case as a larger circle 24. Preferably, the clearance regions 23, in so far as possible and compatible with the electronic structure which is provided, are set so closely against one another that the outer edges 24 of immediately adjacent boreholes 11, 12, 212, 211 or respectively 13, 14, 214, 211 touch one another. Between such immediately adjacent boreholes, respectively a non-wettable area 25 of the solder resist mask remains; in the example embodiment which is shown, this area 25 has the shape of a rhombus or "diamond" shape. These areas 25 are provided in order, in the later step, to delimit the amount of the solder received in the cleared regions and in order to better define the surface of the solder. In general, the shape of such an area, which is bordered by several clearance regions, corresponds to a "concave polygon", i.e. a polygon-like figure, which is formed from concave curve segments, in particular circle segments, mostly a concave quadrilateral or concave triangle. With such a "concave polygon", therefore, the mentioned concave curves or respectively circle segments occur instead of straight-lined edges. Between clearance regions, which are provided for vias, between which no electrical contact must come about in the electronic layout, a bridge remains, however, with a minimum width which is determined in advance. The value of the minimum width depends respectively on layout specifications; a typical value is e.g. 100 µm, but can also be 50 µm or less. Generally, a value is selected which ensures an electrical separation between the produced vias. In these cases, the "concave polygons" run out at the points, which lie between such electrical separated vias, into the mentioned bridges and are therefore connected with one another if applicable by these bridges. Clearances are also provided on the upper surface—solder resist mask 31—at the sites of the openings of the boreholes, corresponding to the edges 32. Here, however, the clearance in the solder resist mask 31 on the upper surface B is preferably realized as small as possible; this is to prevent solder material situated in the bores from projecting over the surface of the upper surface after the first reflow soldering of the solder (cf. FIG. 4). The solder resist mask 31 therefore preferably reaches at least up to the edges 32 of the boreholes on the upper surface B. In the embodiment which is shown, the clearance is such that the edge 33 of the second solder resist mask 31 is flush with the edge 32 of the bore. Here, therefore, with each borehole, the edge 33 of the solder resist mask 31 corresponds to the borehole edge 32. Alternatively, in a variant embodiment which is not illustrated, a narrow clearance region can also be taken out around the edge 32, so that the edge of the solder resist mask reaches just up to the edge 32; the remaining distance to the edge 32 is small, so that the meniscus occurring over the opening of the borehole does not project over the surface of the solder resist mask 31 on the upper surface.

Examples of dimensions in the solder resist mask 21 are 0.7 mm diameter of the clearance regions 23 with a diameter of the openings 22, 32 of 0.35 mm.

Figure 8:
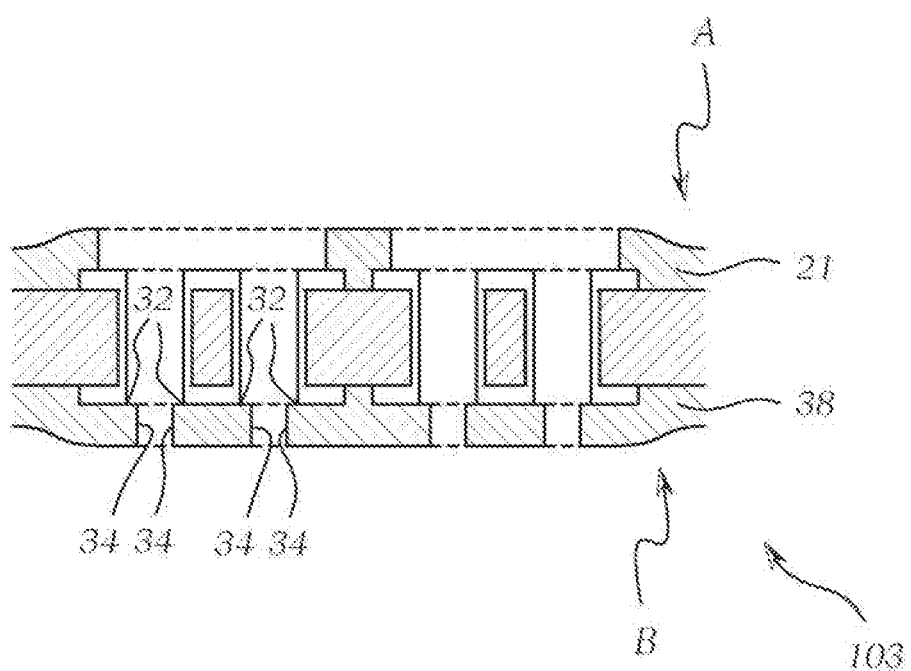
FIG. 8 shows a substrate plate with solder resist masks according to a second embodiment of the invention.

In an advantageous variant embodiment, which is shown in FIG. 8 in a section view of a substrate plate 103, the solder resist mask on the upper surface B can be modified to the effect that the solder resist mask 38 projects over the edges 32 of the boreholes into the respective openings. The solder resist mask 38 therefore forms, in the case of these boreholes, respectively a freestanding inwardly projecting ring 34. This ring 34 prevents an undesired flowing away of the solder, which could lead to undesired voids in the via. Such protruding rings 34 can be provided in all boreholes or in a portion of the boreholes. Otherwise, the substrate plate 103 of FIG. 8 corresponds to the substrate plate 102 of FIG. 2.

The vias are advantageously not closed with solder resist, because this prevents air pockets from occurring in the via and impairing an efficient filling. The solder resist mask 31, 38 therefore prevents solder from being able to exit via the openings, and at the same time through the remaining openings (according to the edges 33 or respectively 34) itself enables an outgassing of the flux. This provides for a forming of the vias without undesired voids (cavities).

Figure 3:
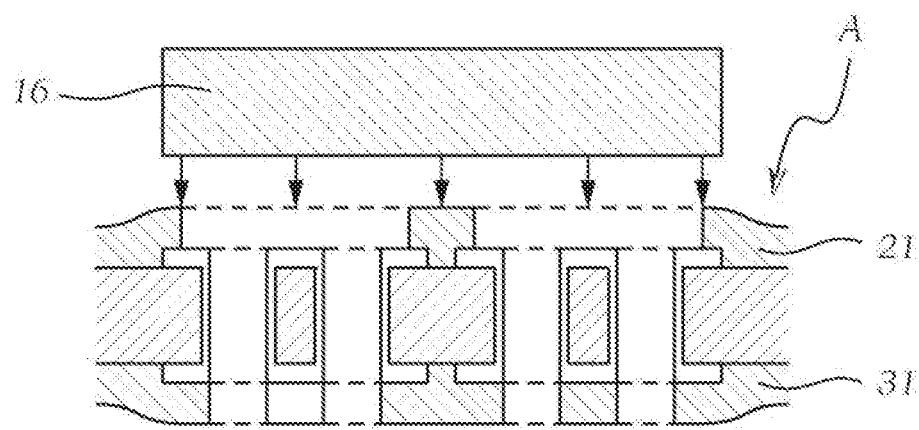
FIG. 3 illustrates the applying and reflow soldering of solder.

With reference to FIG. 3, then in the next step, namely a first reflow soldering pass for example by means of the known SMT method, solder 16 is applied onto the lower surface A. In FIG. 3 the solder 16 is illustrated symbolically by a rectangle with broken hatching. Preferably, the substrate plate is held with the lower surface A oriented upwards at least during this step.

During the reflow soldering, the solder 16 penetrates into the boreholes 11, 12, 13, 14, wherein it advances up to the edges of the solder resist masks 21, 31.

Figure 4:
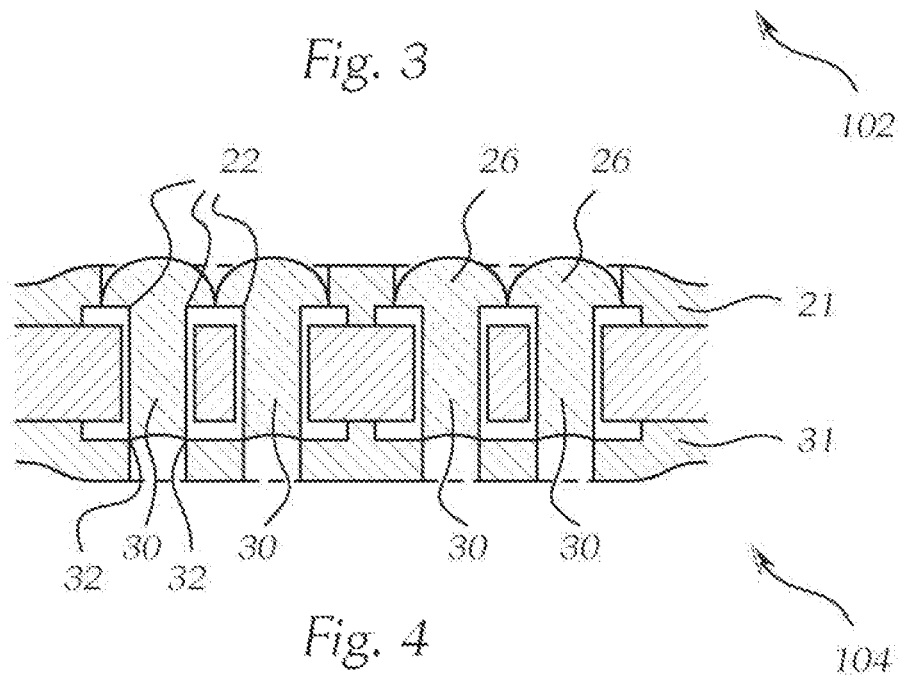
FIG. 4 shows the state achieved by the reflow soldering with filled boreholes in the substrate plate.

The thus obtained state of the substrate plate 104 is illustrated in FIG. 4. The solder advantageously advances on the lower surface A up to the edges 24 of the clearance regions 23 of the solder resist mask 21, so that largely filled boreholes 30 are obtained. The solder 16 forms menisci 26 here on the regions 23, which project over the lower surface edges 22 of the boreholes 30. These menisci 26 preferable receive, through a suitable choice of solder material and quantity, a shape such that they form several small "hills" in the form of convex calottes. This produces an enlarged surface of the menisci, which improves the radiation or respectively dissipation of heat. The menisci 26 correspond in their arrangement naturally to the arrangement of the clearance regions 23 (see FIG. 2(*b*)), so that they preferably touch one another, whereas between the menisci 26 the areas 25, described above, remain with solder resist.

If applicable, according to a variant of the method, during the first reflow soldering pass of FIGS. 3 and 4 at the same time components (not shown) on the lower surface A can be equipped.

On the upper surface B, on the other hand, such menisci are possible in this stage, but are not necessary, with regard to the later solder pass for the upper surface, as described further below.

Figure 5:
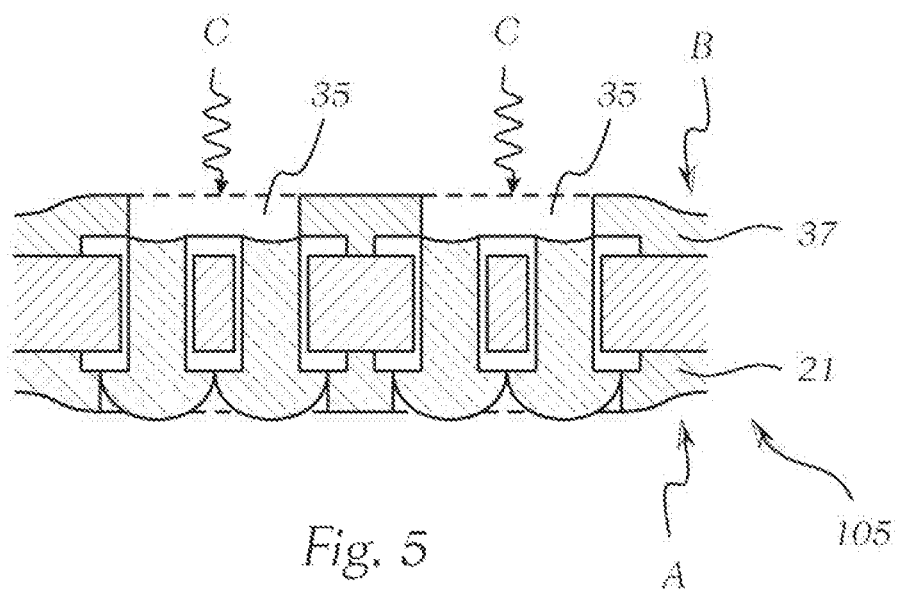
FIG. 5 illustrates the following step of clearing of regions on the upper surface, wherein previously the substrate plate is turned around.

With reference to FIG. 5, a step of the clearing of regions 35 on the upper surface B then takes place. For this, it is generally expedient that the substrate plate is previously turned, so that from now on the upper surface B is turned upwards. The regions 35 are established in advance and correspond to the regions on which, in the subsequent step, electronic components are contacted. At least some of the regions 35 also comprise here the sites of one or more of the previously produced filled boreholes 30.

This step of clearing serves for the regions 35 to be made free from solder resist. For this, the parts of the solder resist mask 31, which are situated in the regions 35, are removed by means of suitable methods C, for example with a chemical or plasma-chemical etching method of known type, by means of lithographic methods, or with the use of a marking laser C. Outside these regions 35 expediently the solder resist of the thus processed solder resist mask 37 remains.

Figure 6:
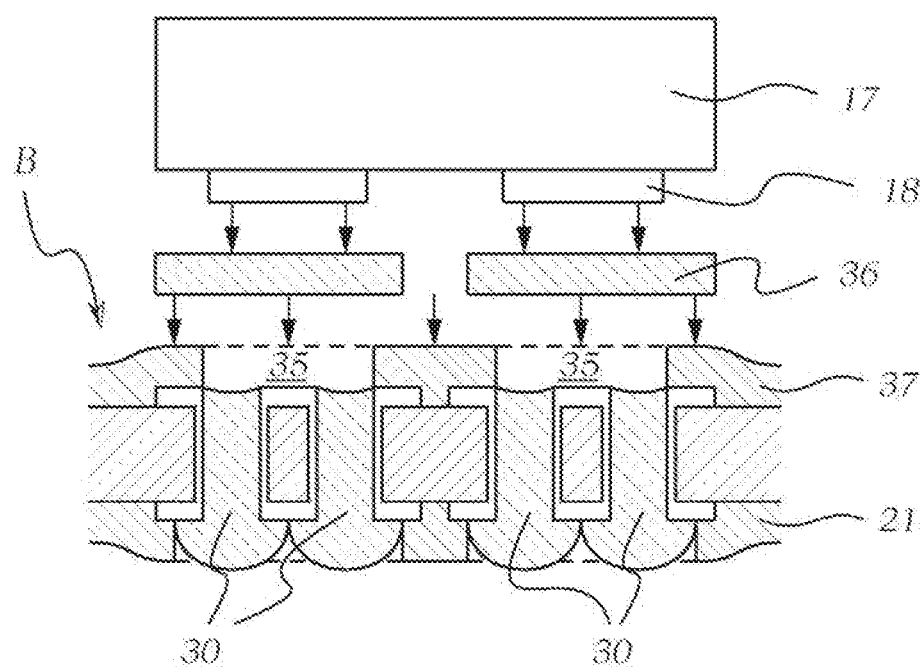
FIG. 6 illustrates the additional step of equipping the substrate plate with electronic components.

Then, as illustrated in FIG. 6, in the next step a second reflow soldering pass takes place on the upper surface B, for example by means of the known SMT method. Here, the upper surface is again printed with solder material 36 in a manner known per se and is equipped with components; in FIG. 6 a component 17 for generally any desired number of components is shown in a representative manner. The solder 36 therefore penetrates during the reflow soldering into the cleared regions 35 and connects on the other side with the contact surfaces 18 of the components 17. Hereby, a direct connection of the contact surfaces 18 with the filled bores 20 is produced.

Figure 7:
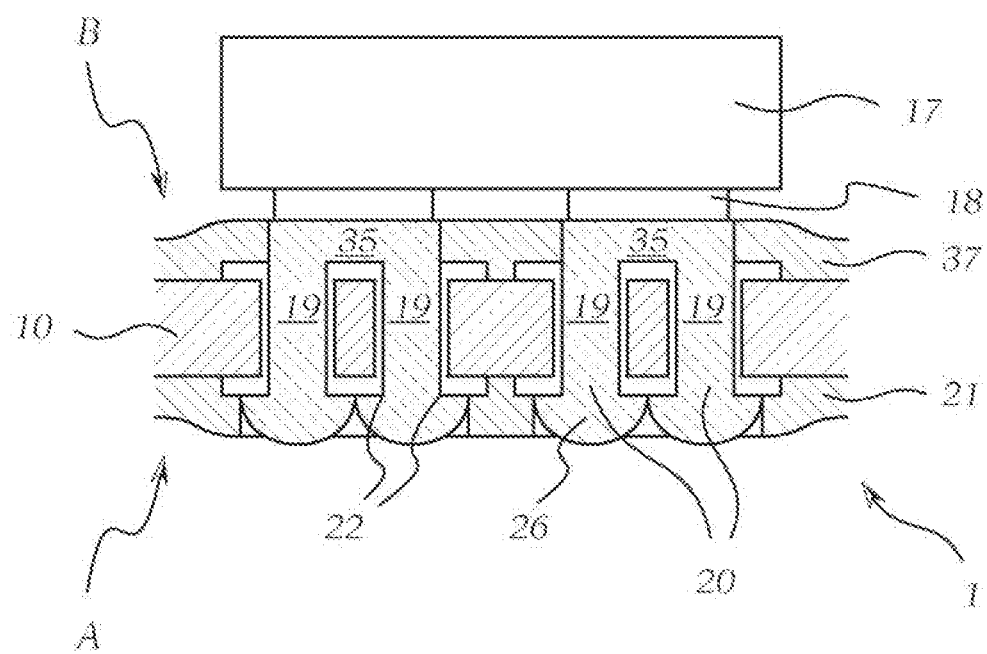
FIG. 7 shows the thus obtained printed circuit board.

FIG. 7 shows the thus obtained printed circuit board 1. At the sites of the boreholes 20 a number of vias 19 are now formed, which are filled with solder material, which extends, free of interruption, to the contact surfaces 18 of the components 17 on the upper surface B (and, if applicable, the lower surface A; not shown), and thus provides for a good thermal and, if applicable, electrical contacting of the components.

Thus, the method according to the invention makes it possible that vias 19 have a position directly under components 17 and can nevertheless be filled in a targeted manner, without, in so doing, having to accept an impairment of the paste printing in the SMT process or a tipping of the components 17.

The invention claimed is:

1. A method for producing thermal vias (19) in a printed circuit board, proceeding from a substrate plate (101) with a plurality of boreholes (11, 12, 13, 14) preformed therein, which are formed between a lower surface (A) and an upper surface (B) of the substrate plate (101) and are located at positions where thermal vias are to be produced respectively, the method comprising the following steps:
   applying a first and a second solder resist mask (21, 31) onto the lower surface (A) and the upper surface (B) respectively, wherein the first solder resist mask (21) has, at the preformed boreholes (11-14), respective regions (23) free from solder resist around the edges (22) of each bore on the lower surface, and wherein the second solder resist mask (31) extends to at least the edges (32) of the boreholes on the upper surface for at least a majority of the preformed boreholes (11-14);
   applying solder (16) onto the lower surface (A) and reflow soldering of the solder, wherein the solder penetrates into the bores (11-14) and forms on the lower surface (A) convex menisci (26) protruding beyond the edge (22) of the respective boreholes; and then
   clearing regions (35) on the upper surface (B), which regions are predetermined for the contacting of at least one electronic component (18) on the upper surface and respectively comprise at least one of the thermal vias, by removal of the second solder resist mask (31) at least in said regions on the upper surface.

2. The method according to claim 1, wherein in the first solder resist mask (21) the regions (23) free from solder resist on the lower surface are configured to be circular ring-shaped.

3. The method according to claim 2, wherein the solder resist-free regions (23) of immediately adjacent boreholes touch one another, whereby between the free regions, areas (25) with solder resist are formed.

4. The method of claim 3, wherein the areas (25) with solder resist have the shape of quadrilaterals or triangles delimited by concave curve segments.

5. The method according to claim 1, wherein the second solder resist mask (31) in at least a part of said boreholes extends over the edge (32), forming a freestanding inwardly projecting ring (34) there, respectively.

6. The method according to claim 1, wherein the second solder resist mask (31) in at least a portion of said boreholes extends to the edge (32), wherein in these boreholes the edge (33) of the second solder resist mask is flush with the edge (32) of the borehole.

7. The method according to claim 1, wherein the substrate plate is held with the lower surface (A) oriented upwards during the step of the applying of solder.

8. The method according to claim 1, further comprising a subsequent additional step:
    equipping the upper surface (B) with at least one electronic component (18) on the cleared regions (35) for contacting.

9. The method according to claim 1, wherein the menisci (26) produced during the reflow soldering of the solder on the lower surface (A) form convex calottes respectively over the boreholes.

10. The method according to claim 1, further comprising an additional step, carried out in advance:
    lining of the preformed boreholes (11-14) with a metal.

11. The method of claim 10, wherein the metal has a high electrical conductivity.

12. The method of claim 11, wherein the metal is copper.

13. The method of claim 10, wherein the lining is by a galvanic method.

14. The method according to claim 1, wherein during the reflow soldering of the solder, the bores (11-14) into which the solder penetrates are filled by the solder (16).

* * * * *